(12) United States Patent
Junhong et al.

(10) Patent No.: US 11,309,182 B2
(45) Date of Patent: Apr. 19, 2022

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Zhao Junhong, Shanghai (CN); Zhao Hai, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 110 days.

(21) Appl. No.: 16/818,051

(22) Filed: Mar. 13, 2020

(65) Prior Publication Data

US 2021/0035803 A1 Feb. 4, 2021

(30) Foreign Application Priority Data

Jul. 31, 2019 (CN) .......................... 201910702059.8

(51) Int. Cl.
*H01L 21/033* (2006.01)
(52) U.S. Cl.
CPC ................ *H01L 21/0337* (2013.01)
(58) Field of Classification Search
CPC ............. H01L 21/3086; H01L 21/0332; H01L 21/0337
See application file for complete search history.

(56) References Cited

U.S. PATENT DOCUMENTS

| | | | | |
|---|---|---|---|---|
| 10,304,744 | B1* | 5/2019 | Joseph ................ | H01L 21/3086 |
| 2008/0122125 | A1* | 5/2008 | Zhou ................... | H01L 21/3088 257/797 |
| 2008/0299465 | A1* | 12/2008 | Bencher ............. | H01L 21/0274 430/5 |

* cited by examiner

*Primary Examiner* — Walter H Swanson
(74) *Attorney, Agent, or Firm* — Crowell & Moring LLP

(57) ABSTRACT

A semiconductor structure and a method for forming the same are provided. In one form, the method includes: providing a base, where a bottom core material layer is formed on the base, a plurality of discrete top core layers is formed on the bottom core material layer, an area between top core layers of the plurality of adjacent top core layers is a groove, and the groove includes a connecting groove; forming a first spacer film conformally covering the plurality of discrete top core layers and the bottom core material layer; forming a blocking structure in a remainder of the connecting groove exposed from the first spacer film; removing first spacer films on a top of the top core layers of the plurality of discrete top core layers and on the bottom core material layer using the blocking structure as a mask, to form a first mask spacer; removing the plurality of top core layers; patterning the bottom core material layer using the first mask spacer and the blocking structure as a mask, to form a bottom core layer; forming a second mask spacer on a side wall of the bottom core layer; and removing the bottom core layer. Through the blocking structure, a bottom core layer at a position corresponding to the connecting groove has a relatively large width, thereby directly forming target patterns with different spacings.

13 Claims, 6 Drawing Sheets

SEMICONDUCTOR STRUCTURE AND METHOD FOR FORMING THE SAME

RELATED APPLICATIONS

The present application claims priority to Chinese Patent Appln. No. 201910702059.8, filed Jul. 31, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming the same.

Related Art

Photolithography is a frequently-used patterning method, and it is one of the most critical production technologies in a semiconductor manufacturing process. As a semiconductor process node becomes increasingly smaller, in recent years a self-aligned double patterning (SADP) method has become a popular patterning methods. The method can be used to increase a density of a pattern formed on a substrate, to further reduce a pitch between two adjacent patterns, and to thereby overcome a limit of a lithographic resolution in the lithography process.

As a critical dimension (CD) becomes increasingly smaller, a self-aligned quadruple patterning (SAQP) method has emerged. A density of a pattern formed on a substrate using the self-aligned dual patterning method is twice a density of a pattern formed on a substrate using the photolithography process, that is, half of a minimum pitch (½ pitch) can be obtained. However, in the self-aligned quadruple patterning method, a density of a pattern formed on a substrate is four times the density of the pattern formed on a substrate using the photolithography process without a change of a current lithography technology (that is, a dimension of a lithography window is unchanged), that is, quarter of a minimum pitch (¼ pitch) can be obtained, so that a density of a semiconductor integrated circuit can be greatly improved, and a critical dimension of a pattern is reduced, thereby helping improve device performance. cl SUMMARY A problem to be addressed in embodiments and implementations of the present disclosure is to provide a semiconductor structure and a method for forming the same, so as to meet different spacing requirements of target patterns.

To address the problem, embodiments and implementations of the present disclosure provide a method for forming a semiconductor structure. In one form, a method includes: providing a base, on which a bottom core material layer is formed, a plurality of discrete top core layers are formed on the bottom core material layer, an area between the adjacent top core layers of the plurality of discrete top core layers is used as a groove, and the groove includes a connecting groove adapted to form a blocking structure; forming a first spacer film conformally covering the plurality of discrete top core layers and the bottom core material layer; forming a blocking structure in a remainder of the connecting groove exposed from the first spacer film; removing first spacer films on a top of the top core layers of the plurality of discrete top core layers and on the bottom core material layer using the blocking structure as a mask, to retain, as a first mask spacer, remainders of the first spacer film that are located on a side wall of the top core layer of the plurality of discrete top core layers and at a bottom of the blocking structure; removing the plurality of discrete top core layers; after the plurality of discrete top core layers is removed, patterning the bottom core material layer using the first mask spacer and the blocking structure as a mask, to form a bottom core layer; forming a second mask spacer on a side wall of the bottom core layer; and after the second mask spacer is formed, removing the bottom core layer.

Embodiments and implementations of the present disclosure further provide a semiconductor structure. In one form, a semiconductor structure includes: a base; a bottom core material layer located on the base; a plurality of discrete top core layers located on the bottom core material layer, where an area between adjacent top core layers of the plurality of discrete top core layers is used as a groove, and the groove includes a connecting groove; a spacer film conformally covering the plurality of discrete top core layers and the bottom core material layer; and a blocking structure filled in a remainder of the connecting groove exposed from the spacer film.

Compared to the prior art, technical solutions of embodiments and implementations of the present disclosure have the following advantages:

In embodiments and implementations of the present disclosure, the plurality of discrete top core layers are formed on the bottom core material layer, where the area between adjacent top core layers of the plurality of discrete top core layers is used as a groove, which includes a connecting groove adapted to form a blocking structure. Subsequently, after the first spacer film conformally covering the plurality of discrete top core layers and the bottom core material layer is formed, the blocking structure is formed in the remainder of the connecting groove exposed from the first spacer film, and the first spacer films that are located on the side wall of the top core layers of the plurality of discrete top core layers and at the bottom of the blocking structure are used as the first mask spacer. Next, the bottom core material layer is patterned using the first mask spacer and the blocking structure as a mask, to form the bottom core layer. Subsequently, the second mask spacer is formed on the side wall of the bottom core layer, and a pattern is delivered to the base using the second mask spacer, to form the target pattern. Therefore, a spacing (spacer) between adjacent target patterns is determined based on a width of the bottom core layer.

In embodiments and implementations of the present disclosure, the blocking structure is formed, so that a bottom core layer at a position corresponding to the connecting groove has a relatively large width, thereby directly forming target patterns with different spacings according to a design requirement. Compared to a solution in which a portion of a target pattern is removed using an etching process to increase a spacing between remaining target patterns after target patterns with equal spacings are formed, the target pattern formed in embodiments and implementations of the present disclosure does not need to undergo an etching process, so that not only different spacing requirements of target patterns are met, but also quality of the target pattern is ensured.

DETAILED DESCRIPTION

Figure 1:
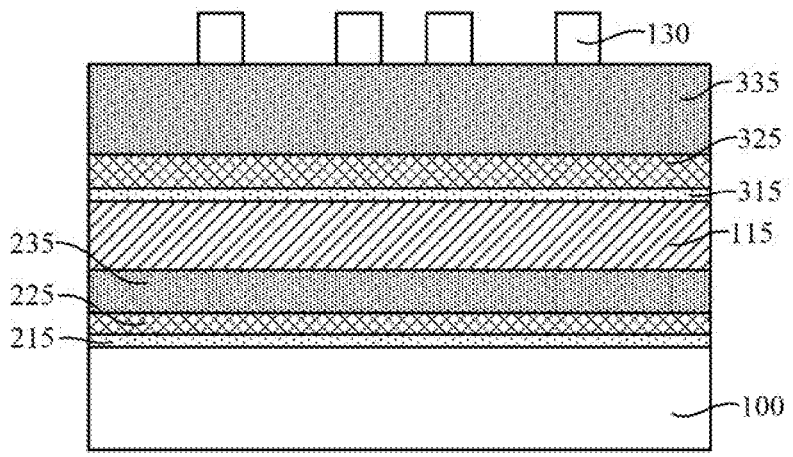
FIG. 1 to FIG. 13 are respective schematic structural diagrams of steps in one form of a method for forming a semiconductor structure.

As a critical dimension of a pattern becomes increasingly small, a self-aligned quadruple patterning method is usually used to form a target pattern, so that the target pattern has a ¼ pitch without a change of a current lithography technology. Although the self-aligned quadruple patterning method can be used to reduce a pitch between target patterns, pitches between target patterns are equal. Therefore, spacings between target patterns are equal, so that different spacing requirements of target patterns cannot be met.

To address the technical problem, in embodiments and implementations of the present disclosure, a bottom core material layer is formed on a base, a plurality of discrete top core layers is formed on the bottom core material layer, and an area between adjacent top core layers of the plurality of discrete top core layers is used as a groove, where the groove includes a connecting groove adapted to form a blocking structure. Subsequently, after a first spacer film conformally covering the plurality of discrete top core layers and the bottom core material layer is formed, a blocking structure is formed in a remainder of the connecting groove exposed from the first spacer film, and first spacer films that are located on a side wall of the top core layer and at a bottom of the blocking structure are used as a first mask spacer.

Next, the bottom core material layer is patterned using the first mask spacer and the blocking structure as a mask, to form a bottom core layer. Subsequently, a second mask spacer is formed on a side wall of the bottom core layer, and a pattern is delivered to the base using the second mask spacer, to form a target pattern. Therefore, a spacing between adjacent target patterns is determined based on a width of the bottom core layer.

In embodiments and implementations of the present disclosure, the blocking structure is formed, so that a bottom core layer at a position corresponding to the connecting groove has a relatively large width, thereby directly forming target patterns with different spacings according to a design requirement. Compared to a solution in which a portion of a target pattern is removed using an etching process to increase a spacing between remaining target patterns after target patterns with equal spacings are formed, the target pattern formed in embodiments and implementations of the present disclosure do not need to undergo an etching process, so that not only different spacing requirements of target patterns are met, but also quality of the target pattern is ensured.

In order to make the foregoing objectives, features, and advantages of embodiments and implementations of the present disclosure more apparent and easier to understand, specific embodiments and implementations of the present disclosure are described in detail below with reference to the accompanying drawings.

FIG. 1 to FIG. 13 are respective schematic structural diagrams of steps in one form of a method for forming a semiconductor structure.

Figure 2:
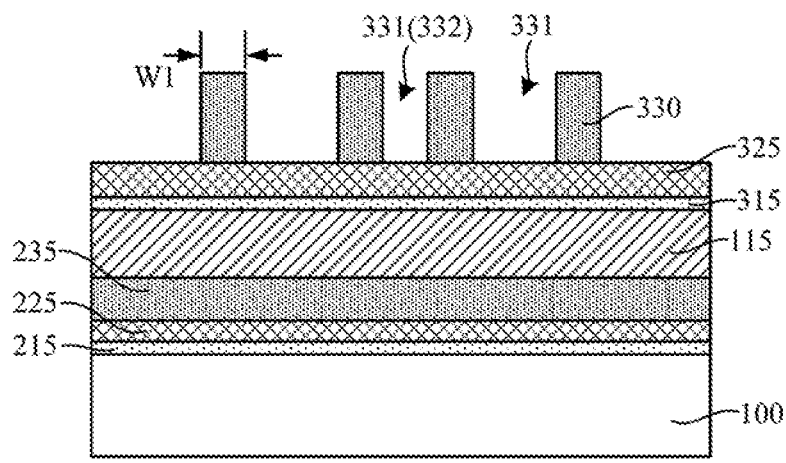

Referring to FIG. 1 and FIG. 2, a base 100 is provided, where a bottom core material layer 115 is formed on the base 100, a plurality of discrete top core layers 330 (shown in FIG. 2) is formed on the bottom core material layer 115, an area between adjacent top core layers of the plurality of discrete top core layers 330 is used as a groove 331 (shown in FIG. 2), and the groove 331 includes a connecting groove 332 (shown in FIG. 2) adapted to form a blocking structure.

The base 100 is configured to prepare for subsequent formation of a target pattern. In some implementations, the base 100 is configured to form a substrate and a fin located on the substrate, that is, the formed target pattern is a fin.

In some implementations, the base 100 is made of silicon. In some other implementations, the base may also be made of other materials such as germanium, silicon germanide, silicon carbide, gallium arsenide, indium gallide, or the like. The base may also be other types of bases such as a silicon base on an insulator or a germanium base on an insulator.

In still other implementations, the base may further include a first semiconductor layer and a second semiconductor layer epitaxially growing on the first semiconductor layer. The first semiconductor layer is configured to provide a process basis for subsequently forming the substrate, and the second semiconductor layer is configured to provide a process basis for subsequently forming the fin.

In other implementations, the substrate may further include other functional to-be-etched layers, such as a gate material layer, and the formed target pattern may also be a gate structure.

The bottom core material layer 115 is configured to provide a process basis for subsequently forming a bottom core layer. A second mask spacer subsequently formed on a side wall of the bottom core layer is used as a mask for patterning the base 100.

After the second mask spacer is subsequently formed, the bottom core layer is further removed. Therefore, the bottom core material layer 115 is made of a material that is easily removed, and relatively few damages are caused to other film layers in a process for removing the bottom core material layer 115.

In some implementations, the bottom core material layer 115 is made of amorphous silicon. Amorphous silicon is a core layer material frequently used in an SAQP process. In other implementations, the bottom core material layer may also be made of amorphous carbon.

It should be noted that, before the bottom core material layer 115 is formed, the method further includes: forming a first buffer layer 215 on the base 100; and forming a polishing stop layer 225 on the first buffer layer 215.

In a polishing process for subsequently forming an isolation structure, a top of the polishing stop layer 225 is configured to define a stop position of the polishing process. In some implementations, the polishing stop layer 225 is made of silicon nitride.

The first buffer layer 215 is configured to provide a buffering effect during forming of the polishing layer 225, to avoid malposition during direct forming of the polishing stop layer 225 on the base 100. In some implementations, the first buffer layer 215 is made of silicon oxide.

It should be noted that before the bottom core material layer 115 is formed, the method further includes: forming a bottom etch stop layer 235 on the polishing stop layer 225.

Subsequently, the bottom core material layer 115 is etched to form a bottom core layer. A top face of the bottom etch stop layer 235 is configured to define a stop position of the etching process, to avoid over-etching, thereby reducing a probability that height of top faces of to-be-etched film layers under the bottom etch stop layer are inconsistent. Therefore, a height and an appearance of a target pattern subsequently formed can meet process requirements.

In addition, the second mask spacer formed on the side wall of the bottom core layer is formed using a combination of deposition and etching, and during forming of the second mask spacer, the bottom etch stop layer 235 can also define the stop position of the etching process. In an SAQP process, a material selected for the mask spacer is generally silicon nitride.

Therefore, in some implementations, the bottom etch stop layer 235 is made of silicon oxide.

Silicon oxide not only costs relatively low but also has relatively high process compatibility. Moreover, there is a relatively high etching selection ratio between amorphous silicon and silicon oxide, and there is also a relatively high etching selection ratio between silicon nitride and silicon oxide, thereby reducing a damage to the bottom etch stop layer 235 in the etching process used to form the bottom core layer and the second mask spacer. In addition, the polishing stop layer 225 is made of silicon nitride, and the bottom etch stop layer 235 is configured to protect the polishing stop layer 225, to avoid a damage to the polishing stop layer 225 in the process for forming the second mask spacer.

In other implementations, based on the materials of the bottom core material layer and the second mask spacer, the bottom etch stop layer may be further made of silicon nitride or silicon oxynitride.

The top core layer 330 is configured to provide a process basis for subsequently forming a first mask spacer. In particular, a first mask spacer is subsequently formed on a side wall of the top core layer 330, and the first mask spacer is configured to define a spacing between adjacent target patterns.

In some implementations, a width of the target pattern is defined as a preset width, and the spacing between the adjacent target patterns is defined as a preset spacing. A width W1 of the top core layer 330 (shown in FIG. 2) is correspondingly equal to a value twice a sum of the preset width and the preset spacing. The width W1 of the top core layer 330 refers to a dimension of the top core layer 330 in a direction perpendicular to a direction in which the top core layer 330 extends.

In particular, the step of forming the top core layer 330 includes: forming a top core material layer 335 on the bottom core material layer 115, which is shown in FIG. 1; forming a photoresist layer 130 on the top core material layer 335, which is shown in FIG. 2; and etching the top core material layer 335 using the photoresist layer 130 as a mask to form the top core layer 330.

In some implementations, after the top core layer 330 is formed, the photoresist layer 130 is removed through ashing or wet stripping.

After the first mask spacer is subsequently formed, the top core layer 330 is further removed. Therefore, the top material layer 330 is made of a material that is easily removed, and relatively few damages are caused to other film layers in a process for removing the top core layer 330.

In some implementations, the top material layer 330 is made of silicon oxide. Selecting silicon oxide facilitates subsequent selection of a suitable material for the first mask spacer and the blocking structure, so that a relatively high etching selection ratio is met between the layers in a subsequent etching process.

An area between the adjacent top core layers 330 is used as a groove 331. Correspondingly, the groove 331 is configured to provide a spatial position for subsequently forming the first mask spacer.

In some implementations, the forming method is used to form target patterns with different spacings, so as to meet different spacing requirements on the target pattern. Therefore, there are a plurality of grooves 331, and the plurality of grooves 331 have different widths (not shown).

The connecting groove 331 is adapted to be filled with the blocking structure, that is, the connecting groove 331 is configured to provide a spatial position for subsequently forming the blocking structure. The connecting groove 332 is configured to define a spacing between partial target patterns.

In some implementations, a width of the connecting groove 331 is smaller than a width of a remainder of groove 331, thereby reducing difficulty of a process for forming a blocking structure in the connecting groove 331.

Still referring to FIG. 1, in some implementations, the method further includes: before the top core material layer 335 is formed, forming a top etch stop layer 325 on the bottom core material layer 115.

During etching of the top core material layer 335 to form the top core layer 330, a top face of the top etch stop layer 325 is configured to define a stop position of the etching process, to avoid over-etching, thereby reducing a probability that height of top faces of to-be-etched film layers under the bottom etch stop layer are inconsistent. Therefore, a height and an appearance of a target pattern subsequently formed can meet process requirements.

Moreover, the first mask spacer formed on the side wall of the top core layer 330 is formed using a combination of deposition and etching, and during forming of the first mask spacer, the top etch stop layer 325 can also define the stop position of the etching process. In a subsequent process, a material selected for the first mask spacer is generally amorphous silicon.

Therefore, in some implementations, the top etch stop layer 325 is made of silicon nitride.

There is a relatively high etching selection ratio between silicon nitride and amorphous silicon, and there is also a relatively high etching selection ratio between silicon nitride and silicon oxide, thereby reducing a damage to the top etch stop layer 325 in the etching process used to form the top core layer 330 and the first mask spacer.

In other implementations, the top etch stop layer may also be made of silicon oxynitride or silicon oxide.

Still referring to FIG. 1, in some implementations, the method further includes: before the top etch stop layer 325 is formed, forming a second buffer layer 315 on the bottom core material layer 115.

The second buffer layer 315 is configured to provide a buffering effect during forming of the top etch stop layer 325, to avoid malposition during direct forming of the top etch stop layer 325 on the bottom core material layer 115. In some implementations, the second buffer layer 315 is made of silicon oxide.

Figure 3:
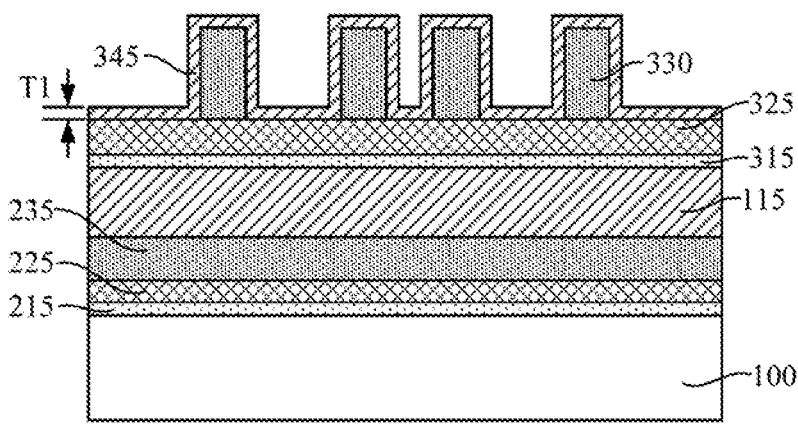

Referring to FIG. 3, a first spacer film 345 conformally covering the top core layer 330 and the bottom core material layer 115 is formed.

The first spacer film 345 is configured to provide a process basis for subsequently forming the first mask spacer covering the side wall of the top core layer 330.

In some implementations, the first spacer film 345 is made of amorphous silicon.

After the first mask spacer is formed, the method further includes a step of removing the top core layer 330. The top core layer 330 is made of silicon oxide. During subsequent removing of the top core layer 330, since the etching selection ratio between silicon oxide and amorphous silicon is relatively high, that is, a rate at which silicon oxide is etched is greater than a rate at which amorphous silicon is etched, a damage to the first mask spacer in the process for removing the top core layer 330 is reduced, thereby helping improve integrity of the first mask spacer.

In other implementations, the first spacer film may also be made of amorphous carbon.

In some implementations, the first mask spacer is configured to define a spacing between partial adjacent target patterns. Therefore, along a direction perpendicular to the side wall of the top core layer 330, the spacing between the partial adjacent target patterns depends on a thickness of the first mask spacer. Correspondingly, a thickness T1 of the first spacer film 345 is equal to the spacing between the partial adjacent target patterns.

In some implementations, the first spacer film 345 is formed using an atomic layer deposition process. The atomic layer deposition process is to form a thin film through deposition layer by layer in a form of a single atomic layer, and is usually used for growth of thin film whose atomic dimension is controllable. The process has relatively strong gap filling capability and step coverage capability. As a semiconductor process node becomes increasingly small, a spacing between adjacent top core layers 330 is increasingly small. Selecting the atomic layer deposition process helps improve forming quality and thickness uniformity of the first spacer film 345, reduces difficulty in controlling the thickness T1 of the first spacer film 345, and further helps improve a conformal covering effect of the first spacer film 345.

In other implementations, the first spacer film may also be formed using a chemical vapor deposition process.

Figure 4:
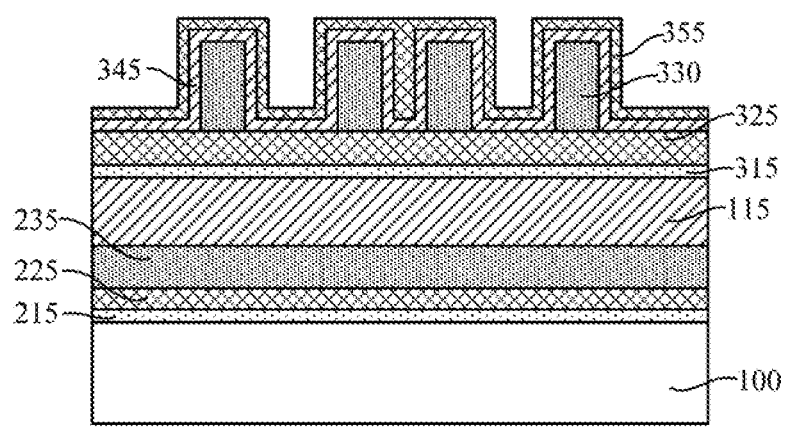
Figure 5:
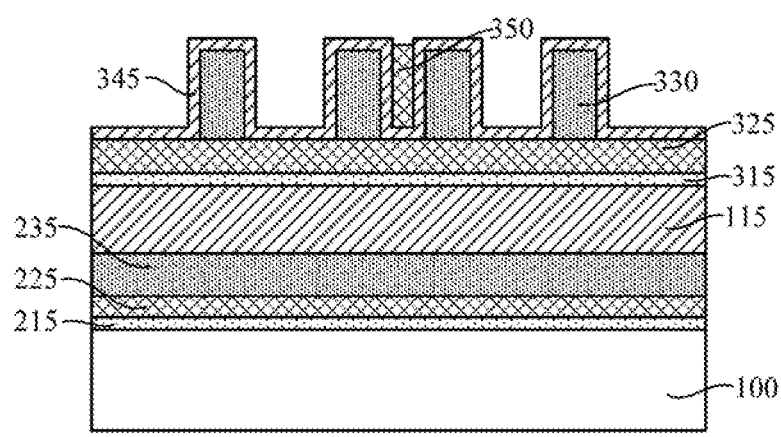

Referring to FIG. 4 and FIG. 5, a blocking structure 350 is formed in a remainder of the connecting groove 332 (shown in FIG. 2) exposed from the first spacer film 345.

The blocking structure 350 is used as a mask for subsequently patterning the bottom core material layer 115.

After the first mask spacer covering the side wall of the top core layer 330 is formed, the bottom mask core layer 115 is etched using the first mask spacer and the blocking structure 350 as a mask, to form a bottom core layer. In addition, a subsequent step further includes forming a second mask spacer on the side wall of the bottom core layer, and delivering a pattern to the base 100 using the second mask space to form a target pattern. Correspondingly, a spacing between adjacent target patterns depends on a width of the bottom core layer. Therefore, in some implementations, the blocking structure 350 is formed, so that a bottom core layer at a position corresponding to the connecting groove 332 has a relatively large width, thereby directly forming target patterns with different spacings according to a design requirement. Compared to a solution in which a portion of a target pattern is removed using an etching process to increase a spacing between remaining target patterns after target patterns with equal spacings are formed, the target pattern formed in some implementations of the present disclosure does not need to undergo an etching process, so that not only different spacing requirements of target patterns are met, but also quality of the target pattern is ensured.

In some implementations, the blocking structure 350 is made of silicon nitride.

After the first mask spacer is subsequently formed, the method further includes a step of removing the top core layer 330. The top core layer 330 is made of silicon oxide. During subsequent removing of the top core layer 330, since the etching selection ratio between silicon oxide and silicon nitride is relatively high (the etching selection ratio is generally greater than 30:1), that is, the rate at which silicon oxide is etched is greater than a rate at which silicon nitride is etched, a loss caused to the blocking structure 350 in the process for removing the top core layer 330 can be reduced, so that the blocking structure 350 can function as a mask during subsequent patterning of the bottom core material layer 115.

Moreover, the first spacer film 345 is made of amorphous silicon, and a manufacture procedure of forming the blocking structure 350 generally includes an etching process. During the etching process, since the etching selection ratio between silicon nitride and amorphous silicon is relatively high, that is, the rate at which silicon nitride is etched is greater than the rate at which amorphous silicon is etched, a probability of causing a loss to the first spacer film 345 during forming of the blocking structure 350 is relatively low, so that quality of the first spacer film is ensured.

In addition, the method further includes a subsequent step of etching the first spacer film 345 to form the first mask spacer. During the etching process, since the etching selection ratio between amorphous silicon and silicon nitride is relatively high, that is, the rate at which amorphous silicon is etched is greater than the rate at which silicon nitride is etched, a probability of causing a loss to the blocking structure 350 during forming of the first mask spacer is relatively low, so that quality of the blocking structure 350 is ensured, and a flatness of a top face of the blocking structure 350 is improved.

In summary, in some implementations, the etching selection ratios among silicon nitride, amorphous silicon, and silicon oxide are utilized to improve integrity of the first mask spacer and the blocking structure 350, thereby improving accuracy of subsequent delivering of a pattern.

In particular, the step of forming the blocking structure 350 includes the following steps.

Referring to FIG. 4, a blocking film 355 conformally covering the first spacer film 345 is formed, the blocking film 355 being filled in the remainder (shown in FIG. 2) of the connecting groove 332 exposed from the first spacer film 345.

The blocking film 355 is configured to provide a process basis for subsequently forming the blocking structure.

In some implementations, the blocking film 355 is formed using an atomic layer deposition process.

A width of the connecting groove 332 is smaller than a width of the remainder of the groove 331. During forming of the blocking film 355, as a thickness of deposited materials increases, blocking films 355 located at side walls of the connecting groove 332 finally contact with each other, thereby filling the connecting groove 332.

Selecting the atomic layer deposition process improves a conformal covering effect and thickness uniformity of the blocking film 355. Therefore, the blocking film 355 on the first spacer film 345 is easily removed subsequently, and the blocking film 335 in the connecting groove 332 is retained. Moreover, selecting the atomic layer deposition process can meet a development trend that a semiconductor process node becomes increasingly small.

Correspondingly, in some implementations, a difference between the width of the connecting groove 332 and a value twice the thickness T1 (shown in FIG. 3) of the first spacer film 345 is less than or equal to a value twice a thickness of the blocking film 355, so that the blocking film 355 can be filled in the connecting groove 332.

Referring to FIG. 5, the blocking film 355 on the first spacer film 345 is removed, to retain a remainder of the blocking film 355 in the connecting groove 332 (shown in FIG. 2) as the blocking structure 350.

A height of the blocking film 355 located in the connecting groove 332 is larger than the thickness of the blocking film 355. Therefore, the blocking film 335 in the connecting groove 332 is difficult to be removed, so that the blocking film 335 in the connecting groove 332 can be retained while the blocking film 355 outside the connecting groove 332 is removed.

Therefore, in some implementations, the blocking film 355 on the first spacer film 345 is removed using an isotropic maskless etching (blanket etch) process. Using the isotropic maskless etching process not only can remove the blocking film 355 on a top of the first spacer film 345 and over the bottom core material layer 115, but also can remove a blocking film 355 on a side wall of the first spacer film 345.

In some implementations, the isotropic maskless etching process is an isotropic dry etching process. Selecting the isotropic dry etching process helps improve controllability of an etching process. In addition, during etching, a surface of the first spacer film 345 located at the top of the top core layer 330 can be used as an etch stop position, thereby reducing a probability of over-etching the blocking film 335 in the connecting groove 332.

In some implementations, during forming of the blocking structure 350, the first spacer film 345 can protect the top core layer 330 and a film layer (for example, the top etch stop layer 325) under the first spacer film 345, so as to reduce a probability of causing a loss to the top core layer 330 and the film layer under the first spacer film 345, thereby improving accuracy of delivering of a pattern.

It should be noted that, in other implementations, the blocking film may be formed using a chemical vapor deposition process according to an actual situation, the blocking film being filled in the groove exposed from the first spacer film and covering the first spacer film. Correspondingly, a shielding layer is formed on the first spacer film using a mask, the shielding layer covering the first spacer film in the connecting groove. The shielding layer is used as a mask to etch the first spacer film to form the blocking structure.

Figure 6:
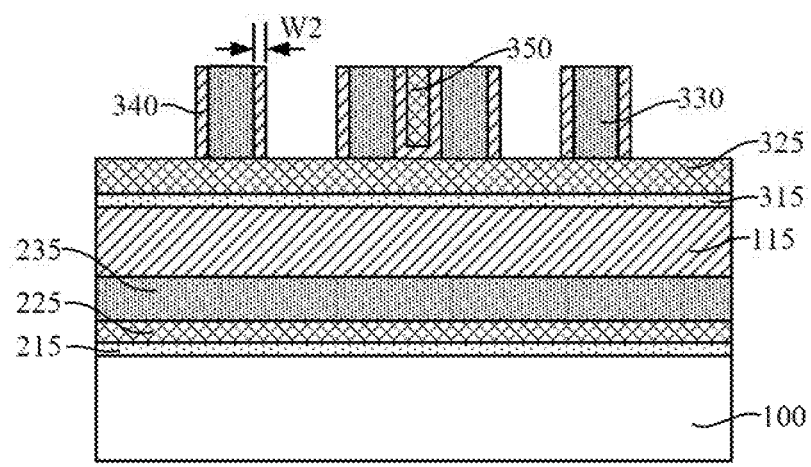

Referring to FIG. 6, first spacer films 345 (shown in FIG. 5) on a top of the top core layer 330 and on the bottom core material layer 115 are removed using the blocking structure 350 as a mask, to retain, as a first mask spacer 340, remainders of the first spacer film 345 that are located on a side wall of the top core layer 330 and at a bottom of the blocking structure 350.

The first mask spacer 340 is also used as a mask for subsequently patterning the bottom core material layer 115. Therefore, along a direction perpendicular to the side wall of the top core layer 330, the spacing between the partial adjacent target patterns depends on a thickness W2 of the first mask spacer 340.

In some implementations, the first mask spacer 340 is formed through etching using an anisotropic maskless etching process. The first spacer film 345 is selectively etched along a normal direction of a surface of the base 100 using an anisotropic maskless etching process, so that the first spacer films 345 on the top of the top core layer 330 and on the bottom core material 115 can be removed, and the first spacer film 345 on the side wall of the top core layer 330 is retained. In particular, the anisotropic maskless etching process is an isotropic dry etching process.

Figure 7:
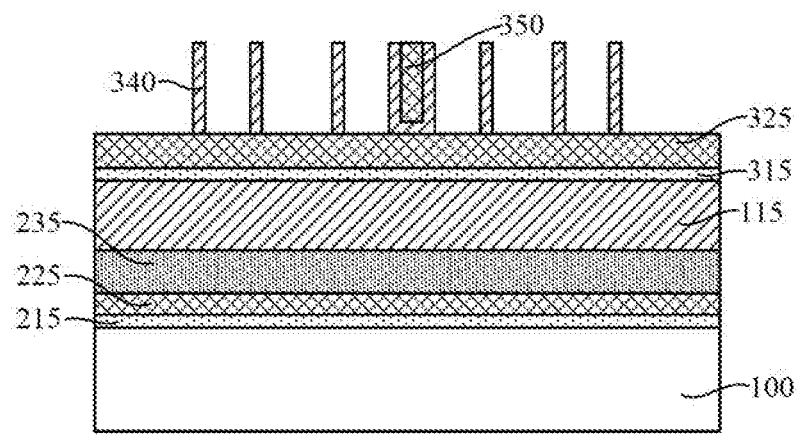

Referring to FIG. 7, after the first mask spacer 340 is formed, the top core layer 330 (shown in FIG. 6) is removed.

The top core layer 330 is removed to prepare for subsequent patterning of the bottom core material layer 115.

In some implementations, the top core layer 330 is removed through etching using a wet etching process, and the top core layer 330 is easily removed completely.

In some implementations, the top core layer 330 is made of silicon oxide, and an etching solution used in the wet etching process is correspondingly a hydrofluoric acid solution.

After the top core layer 330 is removed, the first mask spacer 340 is discretely disposed on the bottom core material layer 115. A first mask spacer 340 is formed on a side wall of the blocking structure 350, and a first mask spacer 340 is formed between the bottom of the blocking structure 350 and the bottom core material layer 115. The first spacer film 345 and the blocking structure 350 can both be used as a mask for subsequent patterning of the bottom core material layer 115.

Figure 8:
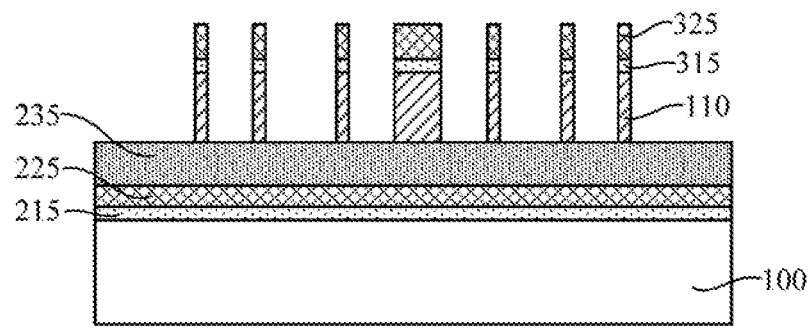

Referring to FIG. 8, after the top core layer 330 (shown in FIG. 6) is removed, the first mask spacer 340 (shown in FIG. 7) and the blocking structure 350 (shown in FIG. 7) are used as a mask to pattern the bottom core material layer 115 (shown in FIG. 7), to form a plurality of discrete bottom core layers 110.

The bottom core layer 110 is configured to provide a process basis for subsequently forming the second mask spacer, thereby implementing pattern delivering using an SAQP process.

In some implementations, along a direction in which the base 100 is directed to the bottom core material layer 115, a second buffer layer 315 and a top etch stop layer 325 are sequentially formed on the bottom core material layer 115. Therefore, the top etch stop layer 325, the second buffer layer 315, and the bottom core material layer 115 are sequentially etched using a dry etching process and using the first mask spacer 340 and the blocking structure 350 are a mask.

The dry etching process has anisotropic etching characteristics, helping improve appearance quality of the bottom core layer 110. Moreover, in the dry etching process, an etching parameter can be adjusted to sequentially etch the top etch stop layer 325, the second buffer layer 315, and the bottom core material layer 115 in a same apparatus. The process is simple and machine conversion is not required.

It should be noted that the first mask spacer 340 is further located between the bottom of the blocking structure 350 and the bottom core material layer 115. Therefore, during pattern delivering, even if a loss is caused to the blocking structure 350, the first mask spacer 340 at the bottom of the blocking structure 350 can still function as an etch mask, and a process risk is low.

It should be further noted that, during pattern delivering, a loss is also caused to the first mask spacer 340 and the blocking structure 350. In some implementations, after the bottom core layer 110 is formed, the first mask spacer 340 and the blocking structure 350 both have been removed.

The first mask spacer 340 and the blocking structure 350 are both used as a mask for patterning the bottom core material layer 115. Therefore, at a position corresponding to the connecting groove 332 (shown in FIG. 2), a width of the bottom core layer 110 is equal to a width of the connecting groove 332.

Figure 9:
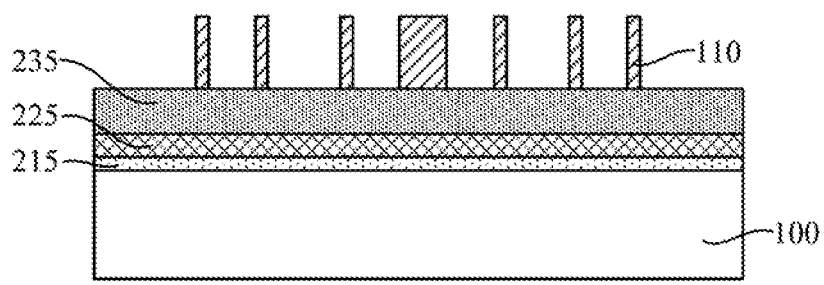

Referring to FIG. 9, after the bottom core layer 110 is formed, the method further includes: removing remainders of the top etch stop layer 325 and the second buffer layer 315 on the top of the bottom core layer 110.

In particular, the step of removing the remainders of the top etch stop layer 325 and the second buffer layer 315 includes: forming a protective layer (not shown) on the bottom etch stop layer 235, the protective layer sequentially exposing the top etch stop layer 325 and the second buffer layer 315; after the protective layer is formed, sequentially etching the top etch stop layer 325 and the second buffer layer 315; and removing the protective layer.

The bottom etch stop layer 235 and the second buffer layer 315 are made of a same material, and the protective layer is configured to protect the bottom etch stop layer 235, to prevent the bottom etch stop layer 235 from being damaged.

The protective layer is made of a material that is easily removed, and a process for removing the protective layer causes fewer damages to the bottom etch stop layer 235. In some implementations, the protective layer is made of a bottom anti-reflective coating (BARC) material. In other implementations, the protective layer may also be made of an organic dielectric layer (ODL) material, a photolithographic strand, a dielectric anti-reflective coating (DARC) material, spin on carbon (SOC) material, or a deep UV light absorbing oxide (DUO) layer material.

In some implementations, the remainders of the etch stop layer 325 and the second buffer layer 315 are removed using a wet etching process, thereby improving a removing effect and removing efficiency.

In some implementations, the top etch stop layer 325 is made of silicon nitride, and the remainder of the top etch stop layer 325 is removed using a tannic acid solution correspondingly.

In some implementations, the second buffer layer 315 is made of silicon oxide, and the remainder of the second buffer layer 315 is removed using a hydrofluoric acid solution correspondingly.

In some implementations, after the remainders of the top etch stop layer 325 and the second buffer layer 315 are removed, the protective layer is removed using an ashing process.

Figure 10:
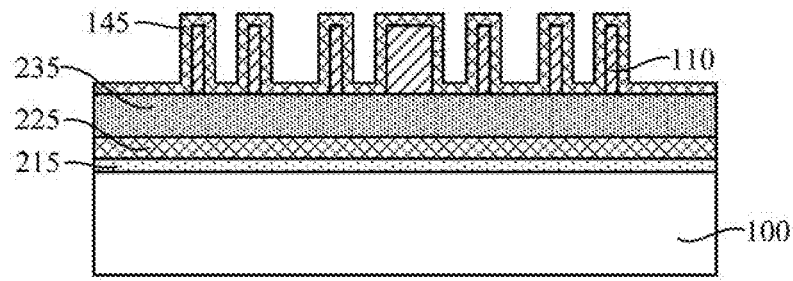
Figure 11:
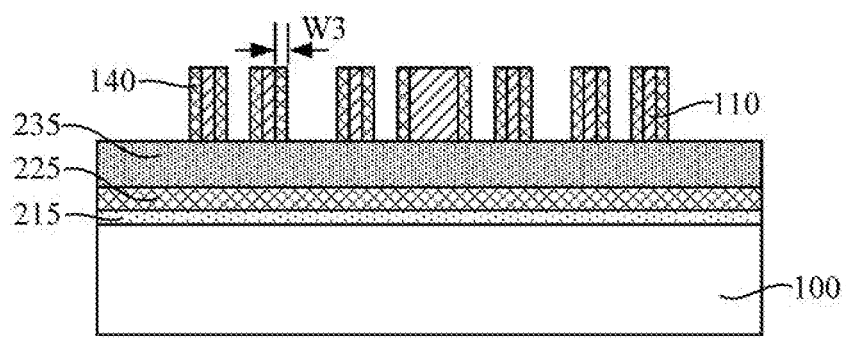

Referring to FIG. 10 and FIG. 11, a second mask spacer 140 is formed on a side wall of the bottom core layer 110.

The second mask spacer 140 is used as a mask for subsequently patterning the base 100 to form a target pattern. Therefore, along a direction perpendicular to the side wall of the bottom core layer 110, a thickness W3 of the second mask spacer 140 is equal to a width of the target pattern.

In particular, the step of forming the second mask spacer 140 includes: forming a second spacer film 145 (shown in FIG. 11) conformally covering the bottom core layer 110 and the base 100; and removing second spacer films 145 on a top of the bottom core layer 110 and on the base 100, to retain a remainder of the second spacer film 145 on a side wall of the bottom core layer 110 as the second mask spacer 140.

In some implementations, the second mask spacer 140 is formed through etching using an anisotropic maskless etching process, so that the second spacer films 145 on the top of the bottom core layer 110 and on the base 100 can be removed, and the second spacer film 145 on the side wall of the bottom core layer 110 is retained.

In particular, the anisotropic maskless etching process is a dry etching process.

In some implementations, the second mask spacer 140 is made of silicon nitride.

Silicon nitride is a material commonly used as an etch mask. Moreover, the bottom etch stop layer 235 is made of silicon oxide, and an etching selection ratio between silicon oxide and silicon nitride is relatively high, so that relatively good delivering of a pattern of the second mask spacer 140 to the bottom etch stop layer 235 can be implemented.

Figure 12:
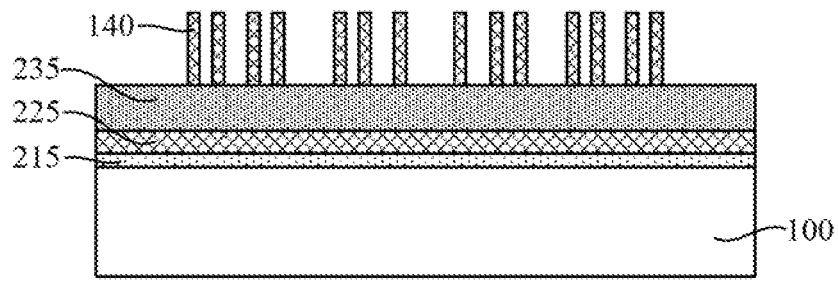

Referring to FIG. 12, after the second mask spacer 140 is formed, the bottom core layer 110 (shown in FIG. 11) is removed.

Removing the bottom core layer 110 provides a process basis for subsequently forming the base 100 for a pattern.

In some implementations, the bottom core layer 110 is removed through etching using a wet etching process, and the bottom core layer 110 is easily removed completely.

In some implementations, the bottom core layer 110 is made of amorphous silicon, and the bottom core layer 110 is removed using a mixed solution of C12 and HBr or a TMAH solution correspondingly.

Figure 13:
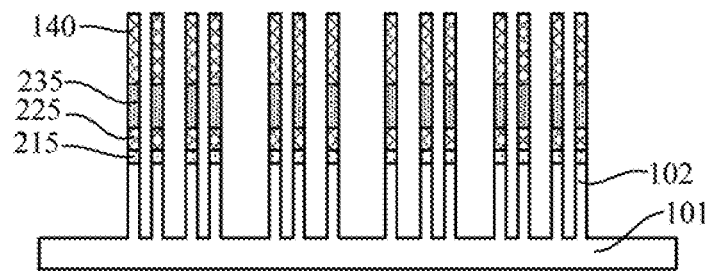

Referring to FIG. 13, the forming method further includes: after the bottom core layer 110 (shown in FIG. 11) is removed, patterning the base 100 (shown in FIG. 12) using the second mask spacer 140 as a mask, to form a target pattern 102 protruding from a remainder of the base 100.

In some implementations, the bottom core layer 110 is configured to define a spacing between adjacent target patterns 102, and the first mask spacer 340 (shown in FIG. 8) and the blocking structure 350 (shown in FIG. 8) are both used as a mask for patterning the bottom core material layer 115 to form the bottom core layer 110. Therefore, under action of the blocking structure 350, after the base 100 is patterned, differently spaced target patterns 102 can be directly formed, thereby meeting different spacing requirements.

In particular, the bottom etch stop layer 235, the polishing stop layer 225, the first buffer layer 215, and the base 100 are sequentially etched using the second mask spacer 140 as a mask, to form a target pattern 102 protruding from the remainder of the base 100.

In some implementations, the bottom etch stop layer 235, the polishing stop layer 225, the first buffer layer 215, and the base 100 are sequentially etched using a dry etching process.

The dry etching process has anisotropic etching characteristics, helping improve appearance quality of the target pattern 102. Moreover, in the dry etching process, an etching parameter can be adjusted to sequentially etch the bottom etch stop layer 235, the polishing stop layer 225, the first buffer layer 215, and the base 100 in a same apparatus. The process is simple and machine conversion is not required.

In some implementations, after the base 100 is patterned, a remainder of the base 100 is used as a substrate 101, and the target pattern 102 is a fin. The fin and the substrate 101 are an integral structure.

In other implementations, when the base includes a first semiconductor layer and a second semiconductor layer epitaxially growing on the first semiconductor layer, in the step of etching the base, only the second semiconductor layer is etched, the first semiconductor layer is used as a substrate, and a remaining second semiconductor layer protruding from the first semiconductor layer is used as a fin. Correspondingly, the fin and the substrate may also be made of different materials.

Figure 14:
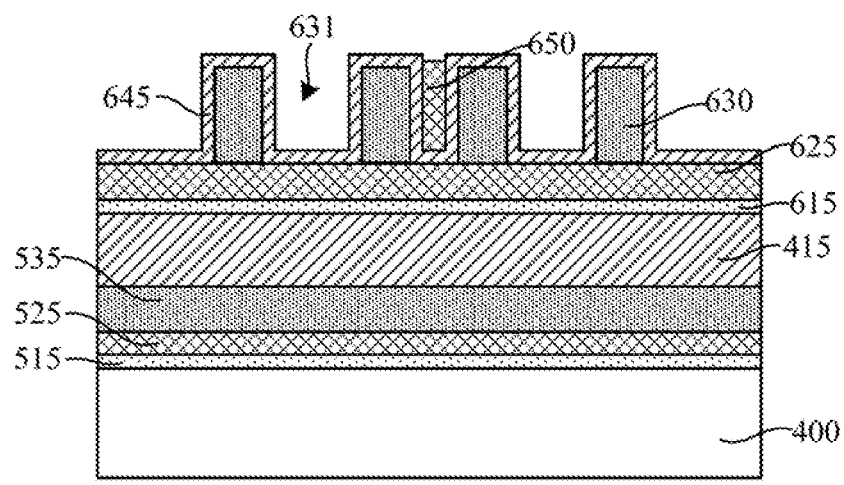
FIG. 14 is a schematic structural diagram of one form of a semiconductor structure.

The present disclosure further provides a semiconductor structure. Referring to FIG. 14, a schematic structural diagram of one form of a semiconductor structure according to the present disclosure is shown.

The semiconductor structure includes: a base 400; a bottom core material layer 415 located on the base 400; a plurality of discrete top core layers 630 located on the bottom core material layer 415, an area between the adjacent top core layers 630 being used as a groove 631, and the groove 631 including a connecting groove (not labeled); a spacer film 645 conformally covering the top core layer 630 and the bottom core material layer 415; and a blocking structure 650 filled in a remainder of the connecting groove exposed from the first spacer film 645.

The base 400 is configured to prepare for formation of a target pattern.

In some implementations, the base 400 is configured to form a substrate and a fin located on the substrate, that is, the formed target pattern is a fin.

In some implementations, the base 400 is made of silicon. In some other implementations, the base may also be made of other materials such as germanium, silicon germanide, silicon carbide, gallium arsenide, indium gallide, or the like. The base may also be other types of bases such as a silicon base on an insulator or a germanium base on an insulator.

In still other implementations, the base may further include a first semiconductor layer and a second semiconductor layer epitaxially growing on the first semiconductor layer. The first semiconductor layer is configured to provide a process basis for subsequently forming the substrate, and the second semiconductor layer is configured to provide a process basis for subsequently forming the fin.

In other implementations, the substrate may further include other functional to-be-etched layers, such as a gate material layer, and the formed target pattern may also be a gate structure.

The bottom core material layer 415 is configured to provide a process basis for subsequently forming a bottom core layer. The bottom core layer is configured to provide a process basis for forming a second mask spacer, and the second mask spacer formed on a side wall of the bottom core layer is used as a mask for patterning the base 400.

After the second mask spacer is subsequently formed, the bottom core layer is further removed. Therefore, the bottom core material layer 415 is made of a material that is easily removed, and relatively few damages are caused to other film layers in a process for removing the bottom core material layer 415.

In some implementations, the bottom core material layer 415 is made of amorphous silicon. Amorphous silicon is a core layer material frequently used in an SAQP process. In other implementations, the bottom core material layer may also be made of amorphous carbon.

It should be noted that the semiconductor structure further includes: a first buffer layer 515 located between the base 400 and the bottom core material layer 415; and a polishing stop layer 525 located between the first buffer layer 515 and the bottom core material layer 415.

In a polishing process for subsequently forming an isolation structure, a top of the polishing stop layer 525 is configured to define a stop position of the polishing process. In some implementations, the polishing stop layer 525 is made of silicon nitride.

The first buffer layer 515 is configured to provide a buffering effect during forming of the polishing layer 525, to avoid malposition during direct forming of the polishing stop layer 525 on the base 400. In some implementations, the first buffer layer 515 is made of silicon oxide.

It should be further noted that the semiconductor structure further includes a bottom etch stop layer 535 located between the polishing stop layer 525 and the bottom core material layer 415.

Subsequently, the bottom core material layer 415 is etched to form a bottom core layer. A top face of the bottom etch stop layer 535 is configured to define a stop position of the etching process, to avoid over-etching, thereby reducing a probability that height of top faces of to-be-etched film layers under the bottom etch stop layer are inconsistent. Therefore, a height and an appearance of a target pattern subsequently formed can meet process requirements. In addition, the second mask spacer formed on the side wall of the bottom core layer is formed using a combination of deposition and etching, and during forming of the second mask spacer, the bottom etch stop layer 535 can also define the stop position of the etching process. In an SAQP process, a material selected for the mask spacer is generally silicon nitride.

Therefore, in some implementations, the bottom etch stop layer 535 is made of silicon oxide.

Silicon oxide not only costs relatively low but also has relatively high process compatibility. In addition, there is a relatively high etching selection ratio between amorphous silicon and silicon oxide, and there is also a relatively high etching selection ratio between silicon nitride and silicon oxide, thereby reducing a damage to the bottom etch stop layer 535 in the etching process used to form the bottom core layer and the second mask spacer. In addition, the polishing stop layer 525 is made of silicon nitride, and the bottom etch stop layer 535 is configured to protect the polishing stop layer 525, to avoid a damage to the polishing stop layer 525 in the process for forming the second mask spacer.

In other implementations, based on the materials of the bottom core material layer and the second mask spacer, the bottom etch stop layer may be further made of silicon nitride or silicon oxynitride.

The top core layer 630 is configured to provide a process basis for forming a first mask spacer.

In particular, a first mask spacer is subsequently formed on a side wall of the top core layer 630, and the first mask spacer is configured to define a spacing between adjacent target patterns.

In some implementations, a width of the target pattern is defined as a preset width, and the spacing between the adjacent target patterns is defined as a preset spacing. A width of the top core layer 630 (not labeled) is correspondingly equal to a value twice a sum of the preset width and the preset spacing. The width of the top core layer 630 refers to a dimension of the top core layer 630 in a direction perpendicular to a direction in which the top core layer 630 extends.

After the first mask spacer is subsequently formed, the top core layer 630 is further removed. Therefore, the top material layer 630 is made of a material that is easily removed, and relatively few damages are caused to other film layers in a process for removing the top core layer 630. In some implementations, the top material layer 630 is made of silicon oxide. Selecting silicon oxide facilitates subsequent selection of a suitable material for the first mask spacer and the blocking structure 650, so that a relatively high etching selection ratio is met between the layers in a subsequent etching process.

In some implementations, the semiconductor structure further includes: a top etch stop layer 625 located on the bottom core material layer 415. Correspondingly, the top core layer 630 is located on the top etch stop layer 625.

The top material layer 630 is formed through etching of the bottom core material layer. A top face of the top etch stop layer 625 is configured to define a stop position of the etching process, to avoid over-etching, thereby reducing a probability that height of top faces of to-be-etched film layers under the bottom etch stop layer are inconsistent. Therefore, a height and an appearance of a target pattern subsequently formed can meet process requirements.

In addition, the spacer film 645 is subsequently etched to form a first mask spacer on the side wall of the top core layer 630, and the top face of the top etch stop layer 625 can also define a stop position of the etching process. The spacer film 645 is made of amorphous silicon.

Therefore, in some implementations, the top etch stop layer 625 is made of silicon nitride.

There is a relatively high etching selection ratio between silicon nitride and amorphous silicon, and there is also a relatively high etching selection ratio between silicon nitride and silicon oxide, thereby reducing a damage to the top etch stop layer 625 in the etching process used to form the top core layer 630 and the first mask spacer.

In other implementations, according to requirements of etching selection ratios among various film layers, the top etch stop layer may also be made of silicon oxynitride or silicon oxide.

In some implementations, the semiconductor structure further includes: a second buffer layer 615 located between the bottom core material layer 415 and the top etch stop layer 625.

The second buffer layer 615 is configured to provide a buffering effect during forming of the top etch stop layer 625, to avoid malposition during direct forming of the top etch stop layer 625 on the bottom core material layer 415. In some implementations, the second buffer layer 615 is made of silicon oxide.

An area between the adjacent top core layers 630 is used as a groove 631. Correspondingly, the groove 631 is configured to provide a spatial position for forming the spacer film 645.

In some implementations, there are a plurality of grooves 631, and the plurality of grooves 631 have different widths (not labeled), so that target patterns with different spacings are formed, thereby meeting different spacing requirements of target patterns.

The connecting groove is adapted to fill the blocking structure 650. The connecting groove is configured to define a spacing between partial target patterns.

In some implementations, a width of the connecting groove is smaller than a width of a remainder of groove 631, thereby reducing difficulty of a process for forming a blocking structure 650 in the connecting groove 631.

The spacer film 645 is configured to provide a process basis for subsequently forming the first mask spacer covering the side wall of the top core layer 630.

In some implementations, the spacer film 645 is made of amorphous silicon.

After the first mask spacer is formed, the method further includes a step of removing the top core layer 630. The top core layer 630 is made of silicon oxide. During subsequent removing of the top core layer 630, since the etching selection ratio between silicon oxide and amorphous silicon is relatively high, that is, a rate at which silicon oxide is etched is greater than a rate at which amorphous silicon is etched, a damage to the first mask spacer in the process for removing the top core layer 630 is reduced, thereby helping improve integrity of the first mask spacer.

In other implementations, the spacer film may also be made of amorphous carbon.

In some implementations, the first mask spacer is configured to define a spacing between adjacent target patterns. Therefore, along a direction perpendicular to the side wall of the top core layer 630, the spacing between the partial adjacent target patterns depends on a width of the first mask spacer. Correspondingly, a thickness of the spacer film 645 is equal to the spacing between the partial adjacent target patterns.

The blocking structure 650 is used as a mask for subsequently patterning the bottom core material layer 115.

After the first mask spacer covering the side wall of the top core layer 630 is formed, the bottom mask core layer 415 is etched using the first mask spacer and the blocking structure 650 as a mask, to form a bottom core layer. In addition, a subsequent step further includes forming a second mask spacer on the side wall of the bottom core layer, and delivering a pattern to the base 400 using the second mask space to form a target pattern. Correspondingly, a spacing between adjacent target patterns depends on a width of the bottom core layer. Therefore, in some implementations, through the blocking structure 650, a bottom core layer at a position corresponding to the connecting groove has a relatively large width, thereby directly forming target patterns with different spacings according to a design requirement. Compared to a solution in which a portion of a target pattern is removed using an etching process to increase a spacing between remaining target patterns after target patterns with equal spacings are formed, the target pattern in some implementations of the present disclosure does not need to undergo an etching process, so that not only different spacing requirements of target patterns are met, but also quality of the target pattern is ensured.

In some implementations, the blocking structure 650 is made of silicon nitride.

After the first mask spacer is subsequently formed, the method further includes a step of removing the top core layer 630. The top core layer 630 is made of silicon oxide. During subsequent removing of the top core layer 630, since the etching selection ratio between silicon oxide and silicon nitride is relatively high, that is, the rate at which silicon oxide is etched is greater than a rate at which silicon nitride is etched, a loss caused to the blocking structure 650 in the process for removing the top core layer 630 is reduced, so that the blocking structure 650 can function as a mask during subsequent patterning of the bottom core material layer 415.

Moreover, the spacer film 645 is made of amorphous silicon, and a manufacture procedure of forming the blocking structure 650 generally includes an etching process. During the etching process, since the etching selection ratio between silicon nitride and amorphous silicon is relatively high, that is, the rate at which silicon nitride is etched is greater than the rate at which amorphous silicon is etched, a probability of causing a loss to the spacer film 645 during forming of the blocking structure 650 is relatively low, so that quality of the first spacer film is ensured.

In addition, the method further includes a subsequent step of etching the spacer film 645 to form the first mask spacer. During the etching process, since the etching selection ratio between amorphous silicon and silicon nitride is relatively high, that is, the rate at which amorphous silicon is etched is greater than the rate at which silicon nitride is etched, a probability of causing a loss to the blocking structure 650 during forming of the first mask spacer is relatively low, so that quality of the blocking structure 650 is ensured.

In summary, in some implementations, the etching selection ratios among silicon nitride, amorphous silicon, and silicon oxide are utilized to improve integrity of the first mask spacer and the blocking structure 650, thereby improving accuracy of subsequent delivering of a pattern.

The semiconductor structure may be formed using the forming method described in the foregoing embodiments, or may be formed using other forming methods. For specific descriptions of the semiconductor structure in these implementations, refer to the corresponding descriptions in the foregoing embodiments, and details are not described again herein.

Although the present disclosure is disclosed as above, the present disclosure is not limited thereto. Various changes and modifications may be made by those skilled in the art without departing from the spirit and scope of the present disclosure. Therefore, the protection scope of the present disclosure should be subject to the scope defined by the claims.

What is claimed is:

1. A method for forming a semiconductor structure, comprising:
providing a base, on which a bottom core material layer is formed, where a plurality of discrete top core layers is formed on the bottom core material layer, an area between adjacent top core layers of the plurality of discrete top core layers is used as a groove, and the groove comprises a connecting groove adapted to form a blocking structure;
forming a first spacer film conformally covering the plurality of discrete top core layers and the bottom core material layer;
forming a blocking structure in a portion of the connecting groove exposed from the first spacer film, wherein forming the blocking structure comprises:
forming a blocking film conformally covering the first spacer film, where the blocking film is filled in the portion of the connecting groove exposed from the first spacer film; and
removing the blocking film on the first spacer film, to retain a portion of the blocking film in the connecting groove as the blocking structure;
removing the first spacer film from a top of the top core layers of the plurality of discrete top core layers and on the bottom core material layer using the blocking structure as a mask, to retain, as a first mask spacer, remainders of the first spacer film that are located on a side wall of the top core layers of the plurality of discrete top core layers and at a bottom of the blocking structure;
removing the plurality of discrete top core layers;
after the plurality of discrete top core layers is removed, patterning the bottom core material layer using the first mask spacer and the blocking structure as a mask, to form a bottom core layer;
forming a second mask spacer on a side wall of the bottom core layer and not on a top of the bottom core layer;
after the second mask spacer is formed, removing the bottom core layer; and
after the bottom core layer is removed, patterning the base using the second mask spacer as a mask, to form a target pattern protruding from a remainder of the base without performing an etching process.

2. The method for forming the semiconductor structure according to claim 1, wherein after the base is patterned, the remainder of the base is used as a substrate, and the target pattern is a fin.

3. The method for forming the semiconductor structure according to claim 1, wherein the top core layers of the plurality of discrete top core layers are made of silicon oxide, the first spacer film is made of amorphous silicon or amorphous carbon, and the blocking structure is made of silicon nitride.

4. The method for forming the semiconductor structure according to claim 3, wherein the bottom core material layer is made of amorphous silicon or amorphous carbon.

5. The method for forming the semiconductor structure according to claim 1, wherein:
in the step of providing the base, there is a plurality of grooves, where the grooves of the plurality of grooves have different widths, and a width of the connecting groove is less than a width of a remainder of the groove.

6. The method for forming the semiconductor structure according to claim 5, wherein the blocking film on the first spacer film is removed using an isotropic dry etching process.

7. The method for forming the semiconductor structure according to claim 5, wherein the blocking film is formed using an atomic layer deposition process.

8. The method for forming the semiconductor structure according to claim 5, wherein a difference between the width of the connecting groove and a value twice a thickness of the first spacer film is less than or equal to a value twice a thickness of the blocking film.

9. The method for forming the semiconductor structure according to claim 1, wherein the first spacer film removed from the top of the top core layers of the plurality of discrete top core layers and removed from the bottom core layer is removed using an anisotropic dry etching process.

10. The method for forming the semiconductor structure according to claim 1, wherein the first spacer film is formed using an atomic layer deposition process.

11. The method for forming the semiconductor structure according to claim 1, wherein forming the second mask spacer on the side wall of the bottom core layer comprises:
forming a second spacer film conformally covering the bottom core layer and the base; and
removing second spacer film on a top of the bottom core layer and on the base, to retain the second spacer film on the side wall of the bottom core layer as the second mask spacer.

12. The method for forming the semiconductor structure according to claim 1, wherein the method further comprises:
before the plurality of discrete top core layers the formed on the bottom core material layer, forming a top etch stop layer on the bottom core material layer.

13. The method for forming the semiconductor structure according to claim 12, wherein the top etch stop layer is made of silicon nitride.

* * * * *